United States Patent
Kuiper

(10) Patent No.: US 12,077,552 B2
(45) Date of Patent: Sep. 3, 2024

(54) SYNTHESIS OF FLUOROALKYL TIN PRECURSORS

(71) Applicant: ENTEGRIS, INC., Billerica, MA (US)

(72) Inventor: David Kuiper, Brookfield, CT (US)

(73) Assignee: ENTEGRIS, INC., Billerica, MA (US)

( * ) Notice: Subject to any disclaimer, the term of this patent is extended or adjusted under 35 U.S.C. 154(b) by 0 days.

(21) Appl. No.: 17/941,931

(22) Filed: Sep. 9, 2022

(65) Prior Publication Data

US 2023/0098280 A1   Mar. 30, 2023

Related U.S. Application Data

(60) Provisional application No. 63/243,885, filed on Sep. 14, 2021.

(51) Int. Cl.
*C23C 16/18* (2006.01)
*C07F 7/22* (2006.01)

(52) U.S. Cl.
CPC .......... *C07F 7/2284* (2013.01); *C23C 16/18* (2013.01)

(58) Field of Classification Search
CPC .............................. C07F 7/2284; C23C 16/18
See application file for complete search history.

(56) References Cited

U.S. PATENT DOCUMENTS

2019/0315782 A1\* 10/2019 Edson ................... C07F 7/2284
2021/0013034 A1    1/2021 Wu

FOREIGN PATENT DOCUMENTS

WO    2017066319 A2    4/2017
WO    2020102085 A1    5/2020

OTHER PUBLICATIONS

Fluorinating Agents in Organic Chemistry, Alfa Aesar, https://www.alfa.com/media/docs/FluorinatingAgents.pdf (8 pages).
Hanssgen et al., Synthese der ersten mono-t-butylzinn-elementverbindungen, Journal of organometallic chemistry, vol. 293, pp. 191-195, 1985.
Seyferth, Tetrakis (perfluoropropyl)tin and other perfluoropropyltin compounds: Synthesis, characterization and reactivity, Journal of Organometallic Chemistry, vol. 499, pp. 131-136, 1995.
Stanley, The Synthesis of Novel Single Source Precursors for the CVD of Fluorine-Doped Tin Oxide, Doctoral Thesis, University of Bath, ProQuest LLC, pp. 1-213, 2014.

\* cited by examiner

*Primary Examiner* — Hai Y Zhang

(57) ABSTRACT

The invention provides certain fluorinated alkyl tin compounds which are believed to be useful in the vapor deposition of tin-containing films onto the surface of microelectronic device substrates. Also provided are processes for the preparation of the precursor compounds and processes for the use of such compounds in the deposition of tin-containing films onto microelectronic device substrates.

8 Claims, No Drawings

SYNTHESIS OF FLUOROALKYL TIN PRECURSORS

PRIORITY CLAIMS

This disclosure claims priority to U.S. Provisional Patent No. 63/243,885 with a filing date of 14 Sep. 2021, which is incorporated by reference herein.

TECHNICAL FIELD

This invention belongs to the field of organotin chemistry. In particular, it relates to a process for preparing certain fluorine-containing tin compounds, which are useful in the vapor deposition of tin-containing films.

BACKGROUND

Certain organotin compounds have been shown to be useful in the deposition of highly pure tin (II) oxide in the manufacture of microelectronic devices. Of particular interest are organotin compounds having a combination of alkylamino groups and alkyl groups, which are useful as liquid precursors in the deposition of tin-containing films onto microelectronic device substrates.

Additionally, certain organometallic compounds have been shown to be useful as precursors in the deposition of highly pure metal oxide films in applications such as extreme ultraviolet (EUV) lithography techniques used in the manufacture of microelectronic devices. In this process, certain organometallic precursors are utilized in conjunction with counter-reactants to form a polymerized organometallic film. A pattern is then formed on the surface, exposing the EUV-patternable film involving exposure of the film using a patterned beam of EUV light, followed by exposing the resulting microelectronic device surface to a post exposure bake in ambient air. This treatment with patterned EUV light leaves some exposed portions of the surface and some non-exposed portions, thus enabling further manipulation and patterning due to the different physical and chemical differences in the two regions. See, for example, US Patent Publication 2021/0013034.

Thus, a need exists for further development of precursor composition and counter-reactant pairings which can be used in this dry (photo)resist process as well a need for improved methodology for use in the deposition of highly pure tin oxide films.

SUMMARY

In summary, the invention provides certain fluorinated alkyl tin compounds which are believed to be useful in the vapor deposition of tin-containing films onto the surface of microelectronic device substrates. In one aspect, the invention provides a compound of the Formula (I):

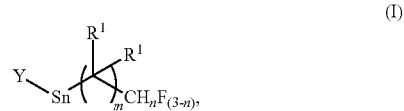
(I)

wherein Y is a group of the formula

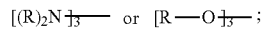

wherein R is independently chosen from H, $C_1$-$C_8$ alkyl, $C_2$-$C_8$ alkenyl, $C_2$-$C_8$ alkynyl, aryl, $C_1$-$C_8$ perfluorinated alkyl, $C_1$-$C_8$ partially fluorinated alkyl, and $R^1$ is chosen from H, $C_1$-$C_8$ alkoxy, $C_1$-$C_8$ alkyl, $C_2$-$C_8$ alkenyl, $C_2$-$C_8$ alkynyl, aryl, $C_1$-$C_8$ perfluoroalkoxy, $C_1$-$C_8$ perfluoroalkyl, and $C_1$-$C_8$ partially fluorinated alkyl, and m is 0-4, and n is 0-3.

DETAILED DESCRIPTION

As used in this specification and the appended claims, the singular forms "a", "an", and "the" include plural referents unless the content clearly dictates otherwise. As used in this specification and the appended claims, the term "or" is generally employed in its sense including "and/or" unless the content clearly dictates otherwise.

The term "about" generally refers to a range of numbers that is considered equivalent to the recited value (e.g., having the same function or result). In many instances, the term "about" may include numbers that are rounded to the nearest significant figure.

Numerical ranges expressed using endpoints include all numbers subsumed within that range (e.g., 1 to 5 includes 1, 1.5, 2, 2.75, 3, 3.80, 4 and 5).

In one aspect, the invention provides a compound of the Formula (I):

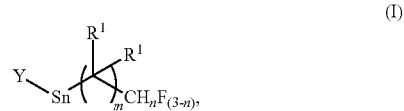
(I)

wherein Y is a group of the formula

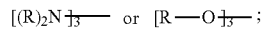

wherein R is independently chosen from H, $C_1$-$C_8$ alkyl, $C_2$-$C_8$ alkenyl, $C_2$-$C_8$ alkynyl, aryl, $C_1$-$C_8$ perfluorinated alkyl, $C_1$-$C_8$ partially fluorinated alkyl, and $R^1$ is chosen from H, $C_1$-$C_8$ alkoxy, $C_1$-$C_8$ alkyl, $C_2$-$C_8$ alkenyl, $C_2$-$C_8$ alkynyl, aryl, $C_1$-$C_8$ perfluoroalkoxy, $C_1$-$C_8$ perfluoroalkyl, and $C_1$-$C_8$ partially fluorinated alkyl, and m is 0-4, and n is 0-3.

In certain embodiments, R is chosen from methyl, ethyl, and isopropyl. In certain embodiments, $R^1$ is chosen from hydrogen, methyl, and ethyl.

In certain embodiments, n is 0 to 2. In some embodiments, $R^1$ is a $C_1$-$C_8$ perfluoroalkyl.

The compounds of Formula (I) can be prepared according to the following scheme:

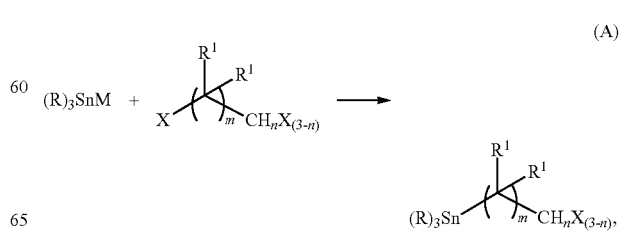
(A)

wherein M is chosen from lithium, potassium, sodium, or a group of the formula MgX, wherein X is chosen from chloro, iodo, and bromo, and R and $R^1$ are as set forth above. Next, the intermediate of formula (A) above is reacted with a compound of the formula M-F in the presence of $Ph_3SnF$ (i.e., triphenyltin fluoride—CAS No. 379-52-2) to afford a compound of the formula (B):

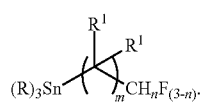
(B)

Similarly, compounds of the formula (B) can be prepared by fluorination of the corresponding bromo, iodo, or chloro compounds by use of known fluorinating agents. See, for example Yanpin Liu, et al., *Organometallics*, 2013, 32, 21, 6587-6592; Yoneda, Norihiko, et al., Chemistry Letters (1987), (8), 1675-8; Makosza, Mieczyslaw, et al., eEROS Encyclopedia of Reagents for Organic Synthesis (2001); Escoula, B., et al., Tetrahedron Letters (1986), 27(13), 1499-1500; Pattison, F. L. M., et al., Journal of the American Chemical Society (1957), 79, 2308-11; Iwasaki, Takanori, et al., Chemical Science (2018), 9(8), 2195-2211; Albanese, Domenico, et al., Journal of Organic Chemistry (1998), 63(25), 9587-9589; and Mathiessen, Bente, et al., Chemistry—A European Journal (2011), 17(28), 7796-7805.

Next, the compound of formula (B), for example, when R is phenyl, can be treated with about one to three molar equivalents of $SnCl_4$ to provide a trichloro tin intermediate of the Formula (C):

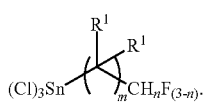
(C)

The compounds of Formula (C) can then be reacted with about 2 to about 5 molar equivalents of a compound of the formula $HN(R)_2$ in the presence of a compound of the formula $LiN(CH_3)_2$ to afford the compounds of Formula (I), wherein Y is a group of the formula

The compounds of Formula (I) wherein Y is a group of the formula

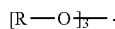

can be prepared by treatment of compounds of Formula (C) with ROH in the presence of secondary or tertiary amines or by treatment of compounds of Formula (C) with MOR where M is selected from an alkali metal.

In an alternate synthetic route, the compounds of Formula (I) wherein n is one (1) can be prepared by direct fluorination of certain intermediates.

Thus, in another aspect, the invention provides a process for preparing a compound of Formula (II):

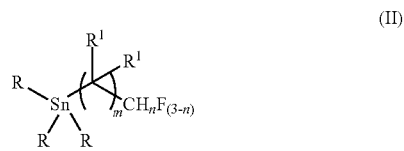
(II)

wherein R is chosen from $C_1$-$C_8$ alkyl, $C_2$-$C_8$ alkenyl, $C_2$-$C_8$ alkynyl, and aryl, and each $R^1$ is independently chosen from H, $C_1$-$C_8$ alkoxy, $C_1$-$C_8$ alkyl, $C_2$-$C_8$ alkenyl, $C_2$-$C_8$ alkynyl, and aryl, which comprise treating a compound of the formula (D):

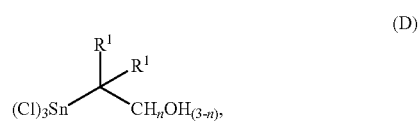
(D)

with a fluorinating agent.

In the above processes, exemplary R and $R^1$ groups include methyl, ethyl, propyl, n-butyl, n-pentyl, vinyl, allyl, 2-alkynylpropane, phenyl, and the like. Suitable fluorinating agents include the known nucleophilic deoxyfluorinating agents such as:

Diethylamino sulfur trifluoride (also known as "DAST");
2-pyridinesulfonyl fluoride, CAS No. 878376-35-3, sold under the mark PyFluor™;
[Methyl(oxo){1-[6-trifluoromethyl)-3-pyridyl]ethyl}-λ6-sulfanylidene]cyanamide; CAS no. 946578-003, also known as "SulfoxaFluor™";
1,3-Bis(2,6-diisopropylphenyl)-2,2-difluoro-2,3-dihydro-1H-imidazole, CAS No. 1314657-40-3, sold under the mark PhenoFluor™;
(Diethylamino)difluorosulfonium tetrafluoroborate, CAS Number 63517-29-3, also known as XtalFluor-E®, sold by OmegaChem, Inc.;
Bis(2-methoxyethyl)aminosulfur trifluoride, CAS Number 202289-38-1, sold under the mark Deoxo-Fluor®, Air Products and Chemicals, Inc.;
Perfluorobutanesulfonyl fluoride, CAS No. 375-72-4, also known as 1,1,2,2,3,3,4,4,4-nonafluorobutane-1-sulfonyl fluoride.
4-Morpholinylsulfur trifluoride, CAS No. 51010-74-3, also known as Morph-DAST; Difluoro-4-morpholinylsulfonium tetrafluoroborate, CAS No. 63517-33-9, also known as XtalFluor-M®, sold by Sigma Aldrich;
4-tert-Butyl-2,6-dimethylphenylsulfur trifluoride, CAS No. 947725-04-4, also known as FLUOLEAD™, sold by TCI chemicals;
N, N-Diethyl-1,1,2,3,3,3-hexafluoropropylamine, CAS No. 309-88-6, also known as Ishikawa's Reagent;
N, N-Diethyl-alpha,alpha-difluoro-3-methylbenzylamine, CAS No. 500131-50-0, also known as DFMBA;
Tetramethylfluoroformamidinium hexafluorophosphate, CAS No. 164298-23-1, also known as TFFH, sold by Sigma Aldrich;
Fluoro-N,N,N',N'-bis(tetramethylene)formamidinium hexafluorophosphate, CAS No. 164298-25-3, also known as BTFFH, sold by Sigma Aldrich; and 1,3-Bis(2,6-diisopropylphenyl)-2,2-difluoro-2,3-dihydro-1H-imidazole, CAS No. 1314657-40-3, also known as PhenoFluor™.

In a further synthetic alternative, the compounds of Formula (I) wherein n is one (1), i.e., the compounds of Formula (II) below, can be prepared by direct fluorination of the corresponding mesylate or tosylate. The compounds of Formula (II) are useful as intermediates for the synthesis of compounds of Formula (I).

In a further aspect, the invention provides a process for preparing a compound of Formula (II):

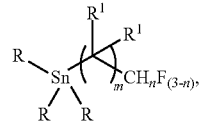
(II)

wherein R is independently chosen from H, $C_1$-$C_8$ alkyl, $C_2$-$C_8$ alkenyl, $C_2$-$C_8$ alkynyl, aryl, $C_1$-$C_8$ perfluorinated alkyl, $C_1$-$C_8$ partially fluorinated alkyl, and $R^1$ is chosen from H, $C_1$-$C_8$ alkoxy, $C_1$-$C_8$ alkyl, $C_2$-$C_8$ alkenyl, $C_2$-$C_8$ alkynyl, aryl, $C_1$-$C_8$ perfluoroalkoxy, $C_1$-$C_8$ perfluoroalkyl, and $C_1$-$C_8$ partially fluorinated alkyl, and m is 0-4, and n is 0-3, which comprise treating a compound of the formula (E):

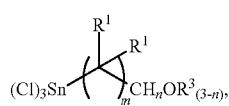
(E)

wherein $R^2$ is toluenesulfonyl, or methanesulfonyl, with a compound of the formula M-F, wherein M is chosen from lithium, potassium, sodium, or a tetra-$C_1$-$C_8$ alkylammonium group. In certain embodiments, this reaction is conducted in the presence of an ionic liquid or a compound such as polyethylene glycol, or a phase transfer catalyst.

Compounds of Formula (E) can be prepared from compounds of the Formula (D) above, by reacting compounds of Formula (D) with a methanesulfonyl or toluenesulfonyl halide such as methanesulfonyl chloride or toluenesulfonyl chloride, in the presence of a base.

Compounds of Formula (D) above, can be prepared using known chemistry according to the following scheme:

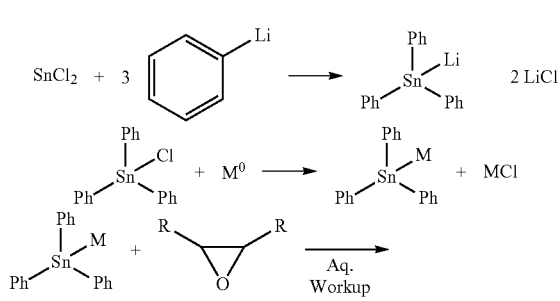

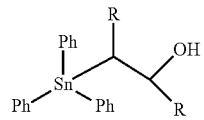
M = Li, Na, K

In an alternate method for the synthesis of compounds of Formula (II), the compound of the formula

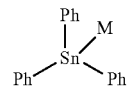

can be reacted with a compound of the formula

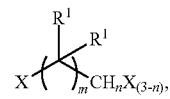

wherein each X is independently chosen from a halogen group, to afford a compound of the formula

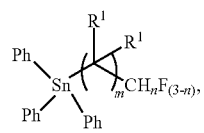

which in turn can be subjected to a halogen exchange reaction in the presence of a compound of the formula M-F. The resulting compound can then be treated with $SnCl_4$, to afford the corresponding trichloro tin compound of the formula

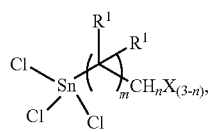

which, after reaction with a compound of the formula $LiN(R)_2$ and at least 2 molar equivalents of a compound of the formula $(R)_2NH$, affords the tris(amido) tin compound of the Formula (III):

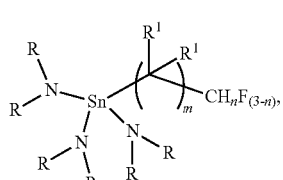
(III)

wherein R is independently chosen from H, $C_1$-$C_8$ alkyl, $C_2$-$C_8$ alkenyl, $C_2$-$C_8$ alkynyl, aryl, $C_1$-$C_8$ perfluorinated alkyl, $C_1$-$C_8$ partially fluorinated alkyl, and $R^1$ is chosen from H, $C_1$-$C_8$ alkoxy, $C_1$-$C_8$ alkyl, $C_2$-$C_8$ alkenyl, $C_2$-$C_8$ alkynyl, aryl, $C_1$-$C_8$ perfluoroalkoxy, $C_1$-$C_8$ Perfluoroalkyl, and $C_1$-$C_8$ Partially fluorinated alkyl, and m is 0-4, and n is 0-3.

In yet a further alternative, compounds of Formula (D) can be prepared according to the following scheme:

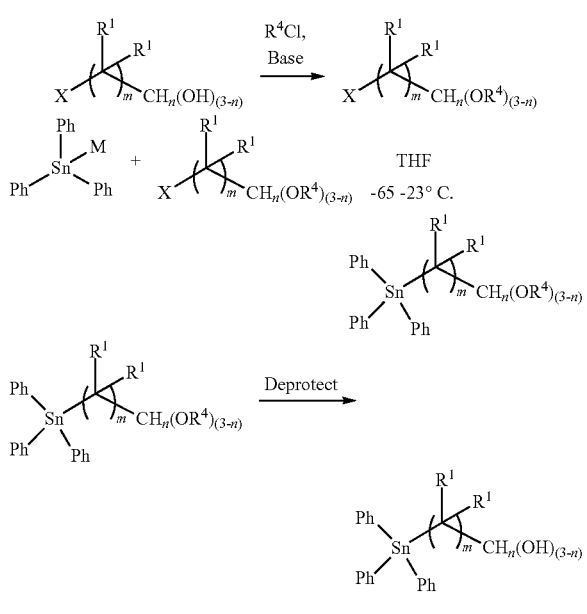

In the above reaction scheme, $R^4$ can be chosen from groups of the formulae —Si(CH$_3$)$_3$, —Si(CH$_2$CH$_3$)$_3$, —Si(isopropyl)$_3$, —Si(t-butyl)$_2$(phenyl), and —Si(CH$_3$)$_2$(t-butyl).

Accordingly, in a further aspect, the invention provides a process for preparing a compound of the formula

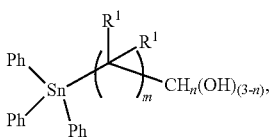

wherein each R' is independently chosen from H, $C_1$-$C_8$ alkyl, $C_2$-$C_8$ alkenyl, $C_2$-$C_8$ alkynyl, and aryl; which comprises treatment of a compound of the formula

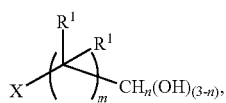

with a compound of the formula $R^2$—$C_1$, in the presence of a base, to afford a compound of the formula

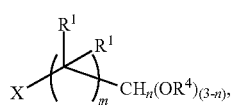

wherein $R^4$ is chosen from groups of the formulae —Si(CH$_3$)$_3$, —Si(CH$_2$CH$_3$)$_3$, —Si(isopropyl)$_3$, —Si(t-butyl)$_2$(phenyl), and —Si(CH$_3$)$_2$(t-butyl); followed by treatment with a compound of the formula (phenyl)$_3$SnNa, to afford a compound of the formula

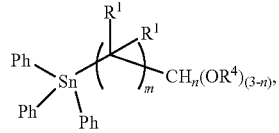

followed by deprotection of the hydroxy group.

As with the compounds of Formula (I), the compounds of (III) are believed to be useful as precursors in the vapor deposition of tin-containing films onto the surface of a microelectronic device substrate, and as noted above, the compounds of Formula (II) are useful as intermediates. Accordingly, in a fourth aspect, the invention provides compounds of Formulae (II) and (III):

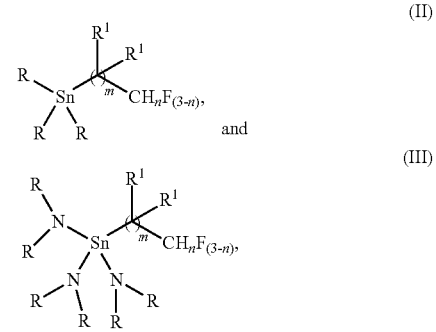

wherein R is independently chosen from H, $C_1$-$C_8$ alkyl, $C_2$-$C_8$ alkenyl, $C_2$-$C_8$ alkynyl, aryl, $C_1$-$C_8$ perfluorinated alkyl, $C_1$-$C_8$ partially fluorinated alkyl, and $R^1$ is chosen from H, $C_1$-$C_8$ alkoxy, $C_1$-$C_8$ alkyl, $C_2$-$C_8$ alkenyl, $C_2$-$C_8$ alkynyl, aryl, $C_1$-$C_8$ perfluoroalkoxy, $C_1$-$C_8$ Perfluoroalkyl, and $C_1$-$C_8$ Partially fluorinated alkyl, and m is 0-4, and n is 0-3.

In certain embodiments, R is chosen from $C_1$-$C_3$ alkyl. In certain embodiments, R is chosen from methyl, ethyl, and isopropyl. In certain embodiments, $R^1$ is chosen from hydrogen, methyl, or ethyl As noted above, these organotin precursor compounds are believed to be useful in various vapor deposition processes when the deposition of a tin-containing film onto a surface of a microelectronic device is desired. Accordingly, in a fifth aspect, the invention provides a process for the deposition of a tin-containing film onto a surface of a microelectronic device in a reaction zone, which comprises introducing into the reaction zone, a precursor composition comprising at least one compound chosen from Formulae (I) and (III) under vapor deposition conditions.

Additionally, the precursors of the invention are believed to be particularly useful in the patterning of microelectronic device substrates using extreme ultraviolet light (EUV) techniques. In this regard, see U.S. Patent Publication 2021/0013034, incorporated herein by reference. It is contemplated that the precursor compositions of the invention, in the form of a vapor stream, are mixed with a counter-reactant in a manner which forms an organometallic material in an oligomeric or polymeric form on a microelectronic device surface. In this fashion, the film so formed becomes an EUV-patternable film, given its reactivity with EUV light.

Accordingly, in a sixth aspect, the invention provides a process for depositing an EUV-patternable film onto a surface of a microelectronic device in a reaction zone, which comprises introducing into the reaction zone a precursor composition comprising reactants chosen from:
a. a precursor composition chosen from at least one compound of the Formulae (I) and (III); and
b. at least one counter-reactant chosen from compounds capable of reacting with reacting with —O—$R^2$ and —$N(R^2)_2$ moieties, wherein $R^2$ is chosen from $C_1$-$C_4$ alkyl, under vapor deposition conditions.

Suitable counter-reactant(s) are those compounds which are capable of replacing the —O—$R^2$ and/or —$N(R^2)_2$ groups on the compounds of Formulae (I) and (III) as set forth above, and include materials such as water, peroxides such as hydrogen peroxide, di- or polyhydroxy alcohols, hydrogen sulfide, hydrogen disulfide, trifluoroacetaldehyde monohydrate, fluorinated di- or polyhydroxy alchohols, and fluorinated glycols.

The thin films thus formed are oligomeric or polymeric organometallic materials comprising $SnO_x$, wherein x is about 1.5 to about 2. Additionally, these EUV-patternable thin films generally vary from about 0.5 to about 100 nm in thickness.

In certain embodiments, vapor deposition conditions comprise reaction conditions known as chemical vapor deposition, pulsed-chemical vapor deposition, and atomic layer deposition. In the case of pulsed-chemical vapor deposition, a series of alternating pulses of the precursor composition and counter-reactant(s), either with or without an intermediate (inert gas) purge step, can be utilized to build up the film thickness to a desired endpoint.

In certain embodiments, the pulse time (i.e., duration of precursor exposure to the substrate) for the precursor compounds depicted above ranges between about 1 and 30 seconds. When a purge step is utilized, the duration is from about 1 to 20 seconds or 1 to 30 seconds. In other embodiments, the pulse time for the co-reactant ranges from 5 to 60 seconds.

In one embodiment, the vapor deposition conditions comprise a temperature in the reaction zone of about 0° C. to about 250° C., or about 22° C. to about 150° C., and at a reduced pressure of about 10 mTorr to about 10 Torr.

The precursor composition comprising the compounds chosen from at least one of formulae (I) through (VI) above, can be employed for forming (a) tin-containing films and (b) high-purity EUV-patternable films, when used in conjunction with the counter-reactant materials referred to above. In the eighth and ninth aspects, any suitable vapor deposition technique, such as chemical vapor deposition (CVD), digital (pulsed) CVD, atomic layer deposition (ALD), or a flowable chemical vapor deposition (FCVD) can be utilized.

In the tenth aspect of the invention, the compounds above may be reacted with the counter-reactant(s) and the surface of the desired microelectronic device substrate in a reaction zone in any suitable manner, for example, in a single wafer CVD or ALD, or in a furnace containing multiple wafers.

Alternatively, the processes of the invention can be conducted as an ALD or ALD-like process. As used herein, the terms "ALD or ALD-like" refer to processes such as (i) each reactant including the precursor composition comprising the compounds chosen from Formulae (I) and (III), the counter-reactant(s) are introduced sequentially into a reactor such as a single wafer ALD reactor, semi-batch ALD reactor, or batch furnace ALD reactor, or (ii) each reactant is exposed to the substrate or microelectronic device surface by moving or rotating the substrate to different sections of the reactor and each section is separated by an inert gas curtain, i.e., spatial ALD reactor or roll to roll ALD reactor. In certain embodiments, the thickness of the ALD film may be from about 0.5 nm to about 40 nm and the deposition temperature ranges from about 30° C. to about 500° C.

The deposition methods disclosed herein may involve one or more purge gases. The purge gas, which is used to purge away unconsumed reactants and/or reaction by-products, is an inert gas that does not react with either the precursor composition or the counter-reactant(s). Exemplary purge gases include, but are not limited to, argon, nitrogen, helium, neon, and mixtures thereof. In certain embodiments, a purge gas such as Ar is supplied into the reactor at a flow rate ranging from about 10 to about 2000 sccm for about 0.1 to 1000 seconds, thereby purging the unreacted material and any by-product that may remain in the reactor. Such purge gasses may also be utilized as inert carrier gasses for either or both of the precursor composition and counter-reactant(s).

The respective step of supplying the precursor composition and the counter-reactant(s), may be performed by changing the sequences for supplying them and/or changing the stoichiometric composition of the resulting EUV-patternable film.

Energy is applied to the precursor composition and the co-reactant(s) in the reaction zone to induce reaction and to form the EUV-patternable film on the microelectronic device surface. Such energy can be provided by, but not limited to, thermal, pulsed thermal, plasma, pulsed plasma, helicon plasma, high density plasma, inductively coupled plasma, X-ray, e-beam, photon, remote plasma methods, and combinations thereof. In certain embodiments, a secondary RF frequency source can be used to modify the plasma characteristics at the substrate surface. In embodiments wherein the deposition involves plasma, the plasma-generated process may comprise a direct plasma-generated process in which plasma is directly generated in the reactor, or alternatively, a remote plasma-generated process in which plasma is generated 'remotely' of the reaction zone and substrate, being supplied into the reactor.

As used herein, the term "microelectronic device" corresponds to semiconductor substrates, including 3D NAND structures, flat panel displays, and microelectromechanical systems (MEMS), manufactured for use in microelectronic, integrated circuit, or computer chip applications. It is to be understood that the term "microelectronic device" is not meant to be limiting in any way and includes any substrate that includes a negative channel metal oxide semiconductor (nMOS) and/or a positive channel metal oxide semiconductor (pMOS) transistor and will eventually become a microelectronic device or microelectronic assembly. Such microelectronic devices contain at least one substrate, which can be chosen from, for example, tin, $SiO_2$, $Si_3N_4$, OSG, FSG, tin carbide, hydrogenated tin carbide, tin nitride, hydrogenated tin nitride, tin carbonitride, hydrogenated tin carbonitride, boronitride, antireflective coatings, photoresists, germanium, germanium-containing, boron-containing, Ga/As, a flexible substrate, porous inorganic materials, metals such as copper and aluminum, and diffusion barrier layers such as but not limited to TiN, Ti(C)N, TaN, Ta(C)N, Ta, W, or WN.

EXAMPLES

Example 1

$Ph_3SnCH_2CH_2(CH_3)OH$ can be synthesized according to the procedure found in Davis, D. D.; Gray, C. E.

Deoxymetalation Reactions. Mechanism of Deoxystannylation. *J. Org. Chem.* 1970, 35 (5), 1303-1307. (Ph=phenyl).

Example 2

Cl(CH$_2$)$_2$O-TMS can be synthesized according to the procedure found in Mander, L. N.; Turner, J. V. Chloroethoxy(Trimethyl)Silane: A Hard-Base Trap Which Preserves Tms Ether Groups and Improves the Wittig Methylenation of Gibberellins. *Tetrahedron Letters* 1981, 22 (41), 4149-4152. (TMS=trimethylsilyl).

Example 3 Ph$_3$SnCH$_2$CH$_2$OTMS

To 32.6 mL of a 0.1M solution of sodium triphenylstannate (3.27 mmol) in tetrahydrofuran (THF) in a 100 mL round bottom flask cooled to −65° C. was added a solution of (2-chloroethoxy)trimethylsilane (0.500 g, 3.27 mmol) in 5 mL THF over 5 minutes. Only a minimal exotherm was observed. The reaction mixture was allowed to stir at −65° C. for 1 hour and then warm to ambient temperature. The reaction mixture was stripped of all volatiles under reduced pressure, slurried in minimal hexanes and filtered over a bed of celite. The filtrates were concentrated down to give 0.650 g of a yellow oil (42%). $^1$H-NMR (149 MHz CDCl$_3$, 298K): δ 7.61-7.57 (m, 6H), 7.18-7.11 (m, 9H), 3.78 (t, 2H), 1.68 (t, 2H), −0.13 (s, 9H). $^{13}$C {$^1$H} NMR (100 MHz, CDCl$_3$ 289K):
δ 139.88, 137.60, 129.00, 128.72, 60.13, 17.44, —0.63 ppm. $^{119}$Sn {$^1$H} NMR (149 MHz CDCl$_3$, 298K): δ-99.61 ppm.

Example 4 Ph$_3$SnCH$_2$CH$_2$OTMS-Deprotection to Ph$_3$SnCH$_2$CH$_2$OH (Prophetic)

The conversion of Ph$_3$SnCH$_2$CH$_2$OTMS to Ph$_3$SnCH$_2$CH$_2$OH may be carried out in a modification of procedures referenced in Protection for the Hydroxyl Group, Including 1,2- and 1,3-Diols. In *Protective Groups in Organic Synthesis*; John Wiley & Sons, Ltd, 1999; pp 119-121.

Anhydrous citric acid (2.05 g, 10.7 mmol) is dissolved in 60 mL of methanol in a 100 mL flask, and trimethyl[2-(triphenylstannyl)ethoxy]silane (5.00 g, 10.7 mmol) is transferred into the flask. The reaction mixture is stirred for 24 hours, stripped of volatiles under reduced pressure, and extracted with 100 mL THF. The THF solution is washed with saturated sodium bicarbonate solution, followed by water, then separated and dried over magnesium sulfate. The volatiles are then removed under reduced pressure to give the product as a white solid.

Example 5 Ph$_3$SnCH$_2$CH$_2$OTBDMS (Prophetic)

To a solution of sodium triphenylstannate (54.0 mL, 54.0 mmol) in THF at −65° C. is added in dropwise fashion a solution of tert-butyl(2-chloroethoxy)dimethylsilane (10.5 g, 54.0 mmol) in 10 mL anhydrous tetrahydrofuran. The dark green solution is allowed to warm to ambient temperature over 18 hours and is then stripped of all volatiles in vacuo. The residue in slurried in minimal hexanes, filtered over a bed of celite, and the filtrates concentrated in vacuo. (TBDS=tert-butyldimethylsilyl).

Example 6 Ph$_3$SnCH$_2$CH$_2$OH from Ph$_3$SnCH$_2$CH$_2$OTBDMS (Prophetic)

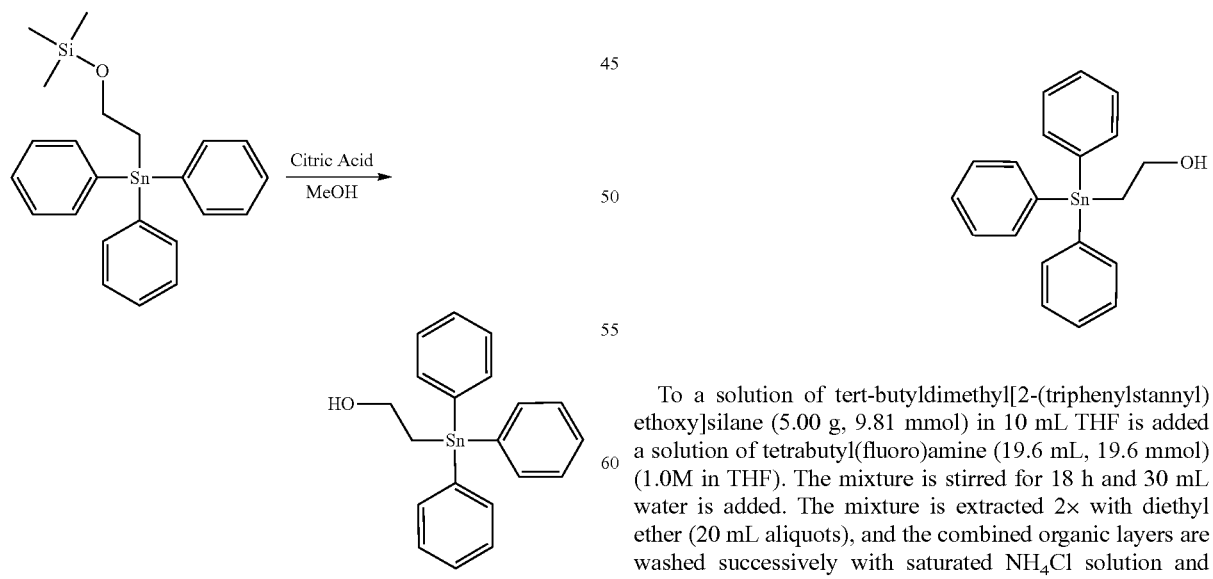

(MeOH = methanol)

To a solution of tert-butyldimethyl[2-(triphenylstannyl)ethoxy]silane (5.00 g, 9.81 mmol) in 10 mL THF is added a solution of tetrabutyl(fluoro)amine (19.6 mL, 19.6 mmol) (1.0M in THF). The mixture is stirred for 18 h and 30 mL water is added. The mixture is extracted 2× with diethyl ether (20 mL aliquots), and the combined organic layers are washed successively with saturated NH$_4$Cl solution and saturated brine solution. The product solution is dried over magnesium sulfate and then stripped of all volatiles under reduced pressure.

Example 7 Ph₃SnCH₂CH₂OTs From Ph₃SnCH₂CH₂OH (Prophetic)

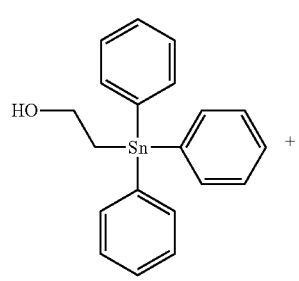

To a stirred solution of Ph₃SnCH₂CH₂OH (3.95 g, 10.00 mmol) in pyridine (6.00 mL, 74.4 mmol) in a 100 mL round bottom flask equipped with a PTFE coated stir egg and cooled to ~5° C. in an ice bath was added p-toluenesulfonyl chloride (2.19 g, 11.5 mmol) in several portions. The resulting mixture is stirred in an ice bath for 3 hours, diluted with 35.0 mL dichloromethane, washed successively with 10 mL 2M HCl, 10 mL water, and 10 mL 10% aqueous sodium bicarbonate solution. The organic layer is separated, dried over magnesium sulfate, and stripped of all volatiles under reduced pressure.

Example 8 Ph₃SnCH₂CH₂—F from Ph₃SnCH₂CH₂OTs (Prophetic)

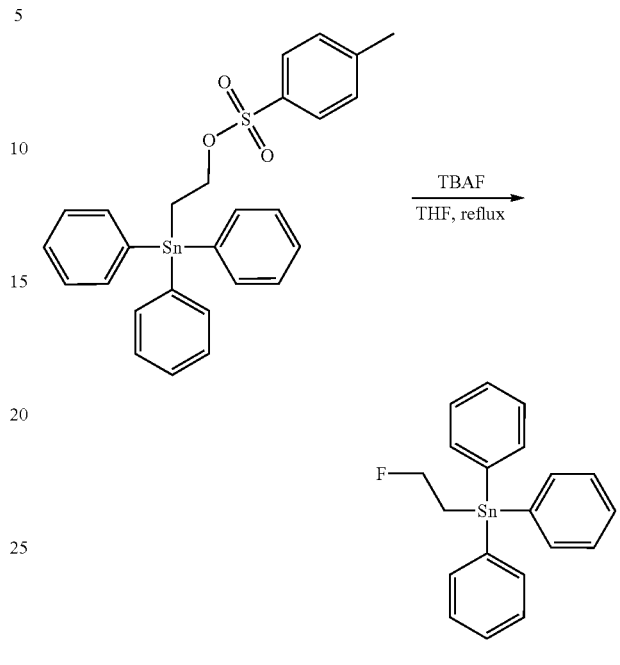

To a solution of 9.55 mL of 1.0M tetrabutylammonium fluoride in THF (9.55 mmol) is added Ph₃SnCH₂CH₂OTs (5.00 g, 9.10 mmol). The solution is refluxed for 18 h and then stripped of all volatiles.

Example 9 Ph₃SnCH₂CH₂—F from Ph₃SnCH₂CH₂OH (Prophetic)

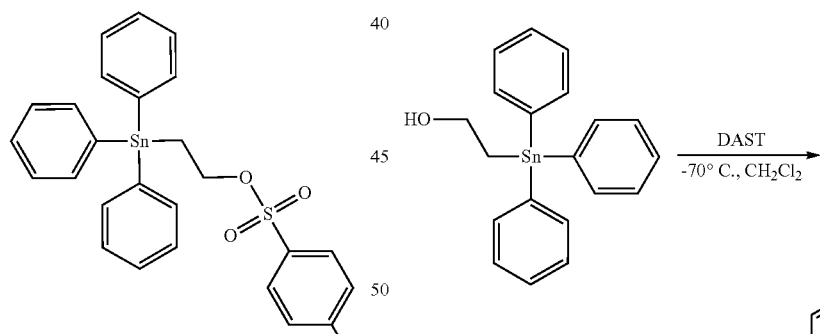

To a cooled (−70° C.) solution of diethylaminosulfur trifluoride (2.29 g, 12.8 mmol) in 25 mL dichloromethane is added a solution of Ph₃SnCH₂CH₂OH (5.00 g, 12.6 mmol) in dropwise fashion. The stirred solution is allowed to warm to ambient temperature over 3 hours. The reaction mixture is added to 50 mL of saturated sodium bicarbonate solution cooled to 0° C., then extracted 2× with 20 mL aliquots of dichloromethane. The combined organic phases are dried with magnesium sulfate and filtered through a silica plug. The product solution is then stripped of volatiles under reduced pressure.

Example 10 Cl$_3$SnCH$_2$CH$_2$—F from Ph$_3$SnCH$_2$CH$_2$—F (Prophetic)

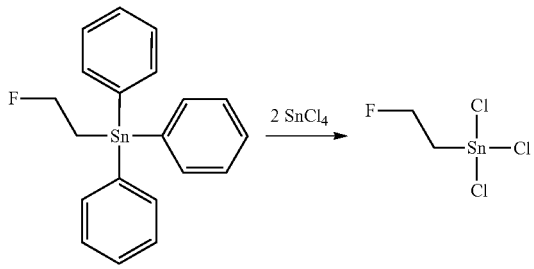 [SMILES: FC[CH2][Sn]([c]1ccccc1)([c]1ccccc1)[c]1ccccc1 ; FC[CH2][Sn]([Cl])([Cl])[Cl]]

A 100 mL flask equipped with a stir bar and thermowell is charged with (2-fluoroethyl)triphenylstannane (40.00 g, 100 mmol) and then treated with tetrachlorostannane (52.1 g, 200 mmol) in several aliquots. When the addition is complete, the flask is fitted to a distillation apparatus with a 1' Vigreux column. The product is then fractionally distilled away from the phenyltrichlorotin and the diphenyldichlorotin at reduced pressure.

Example 11 (Me$_2$N)$_3$SnCH$_2$CH$_2$—F from Cl$_3$SnCH$_2$CH$_2$—F (Prophetic)

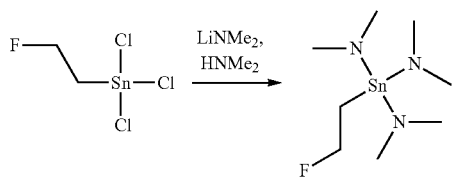

A 3-neck 250 mL round bottom flask equipped with a stir egg is charged with butyllithium (36.0 mL, 57.6 mmol) and 35 mL hexanes. The solution is cooled to 0° C. and then treated with dimethylamine (6.58 g, 146 mmol). The resulting slurry is then cooled to −10° C. and treated with a solution of trichloro(2-fluoroethyl)stannane (5.00 g, 18.3 mmol) in to ambient temperature over 18 hours and is then filtered. The filtrates are concentrated under reduced pressure to give the desired product.

Aspects

In a first aspect, the invention provides a compound of the Formula (I):

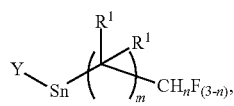

wherein Y is a group of the formula

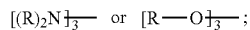

wherein R is independently chosen from H, C$_1$-C$_8$ alkyl, C$_2$-C$_8$ alkenyl, C$_2$-C$_8$ alkynyl, aryl, C$_1$-C$_8$ perfluorinated alkyl, C$_1$-C$_8$ partially fluorinated alkyl, and R$^1$ is chosen from H, C$_1$-C$_8$ alkoxy, C$_1$-C$_8$ alkyl, C$_2$-C$_8$ alkenyl, C$_2$-C$_8$ alkynyl, aryl, C$_1$-C$_8$ perfluoroalkoxy, C$_1$-C$_8$ perfluoroalkyl, and C$_1$-C$_8$ partially fluorinated alkyl, and m is 0-4, and n is 0-3.

In a second aspect, the invention provides the compound of the first aspect, wherein Y is a group of the formula

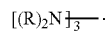

In a third aspect, the invention provides the compound of the first aspect, wherein Y is a group of the formula

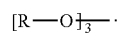

In a fourth aspect, the invention provides the compound of the first, second, or third aspect, wherein n is 2.

In a fifth aspect, the invention provides the compound of any one of the first through fourth aspects, wherein R is chosen from C$_1$-C$_3$ alkyl.

In a sixth aspect, the invention provides the compound of any one of the first through the fifth aspects, wherein R is chosen from methyl, ethyl, and isopropyl.

In a seventh aspect, the invention provides the compound of any one of the first through sixth aspects, wherein R$^1$ is chosen from hydrogen, methyl, or ethyl.

In an eighth aspect, the invention provides the compound of any one of the first through seventh aspects, wherein R is chosen from methyl, ethyl, and isopropyl, and wherein R$^1$ is chosen from hydrogen, methyl, or ethyl.

In a ninth aspect, the invention provides the compound of any one of the first through eighth aspects, wherein R is methyl and R$^1$ is methyl.

In a tenth aspect, the invention provides a process for preparing a compound of the Formula (II):

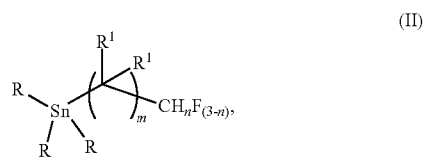

wherein R is independently chosen from H, C$_1$-C$_8$ alkyl, C$_2$-C$_8$ alkenyl, C$_2$-C$_8$ alkynyl, aryl, C$_1$-C$_8$ perfluorinated alkyl, C$_1$-C$_8$ partially fluorinated alkyl, and R$^1$ is chosen from H, C$_1$-C$_8$ alkoxy, C$_1$-C$_8$ alkyl, C$_2$-C$_8$ alkenyl, C$_2$-C$_8$ alkynyl, aryl, C$_1$-C$_8$ perfluoroalkoxy, C$_1$-C$_8$ perfluoroalkyl, and C$_1$-C$_8$ partially fluorinated alkyl, and m is 0-4, and n is 0-3, which comprise treating a compound of the formula (D):

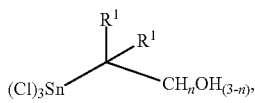

(D)

with a fluorinating agent.

In an eleventh aspect, the invention provides the process of the tenth aspect, wherein the fluorinating agent is chosen from diethylamino sulfur trifluoride; [methyl(oxo){1-[6-trifluoromethyl)-3-pyridyl]ethyl}-λ$^6$-sulfanylidene]cyanamide; 1,3-bis (2,6-diisopropylphenyl)-2,2-difluoro-2,3-dihydro-1H-imidazole; (diethylamino)difluorosulfonium tetrafluoroborate; bis(2-methoxyethyl)aminosulfur trifluoride; perfluorobutanesulfonyl fluoride; 4-morpholinylsulfur trifluoride; difluoro-4-morpholinylsulfonium tetrafluoroborate; 4-tert-butyl-2,6-dimethylphenylsulfur trifluoride; N,N-diethyl-1,1,2,3,3,3-hexafluoropropylamine; N,N-diethyl-alpha,alpha-difluoro-3-methylbenzylamine; tetramethylfluoroformamidinium hexafluorophosphate; fluoro-N,N,N',N'-bis(tetramethylene)formamidinium hexafluorophosphate; and 1,3-bis(2,6-diisopropylphenyl)-2,2-difluoro-2,3-dihydro-1H-imidazole.

In a twelfth aspect, the invention provides the process of the tenth or eleventh aspect, wherein R is phenyl.

In a thirteenth aspect, the invention provides the process of any one of the tenth through the twelfth aspects, wherein $R^1$ is hydrogen or $C_1$-$C_8$ alkyl.

In a fourteenth aspect, the invention provides a process for preparing a compound of the Formula (II):

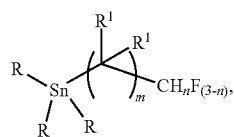

(II)

wherein R is independently chosen from H, $C_1$-$C_8$ alkyl, $C_2$-$C_8$ alkenyl, $C_2$-$C_8$ alkynyl, aryl, $C_1$-$C_8$ perfluorinated alkyl, $C_1$-$C_8$ partially fluorinated alkyl, and $R^1$ is chosen from H, $C_1$-$C_8$ alkoxy, $C_1$-$C_8$ alkyl, $C_2$-$C_8$ alkenyl, $C_2$-$C_8$ alkynyl, aryl, $C_1$-$C_8$ perfluoroalkoxy, $C_1$-$C_8$ perfluoroalkyl, and $C_1$-$C_8$ partially fluorinated alkyl, and m is 0-4, and n is 0-3, which comprise treating a compound of the formula (B):

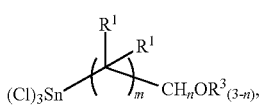

(E)

wherein $R^2$ is toluenesulfonyl, or methanesulfonyl, with a compound of the formula M-F, wherein M is chosen from lithium, potassium, sodium, or a tetra-$C_1$-$C_8$ alkylammonium group.

In a fifteenth aspect, the invention provides the process of the fourteenth aspect, wherein R is phenyl.

In a sixteenth aspect, the invention provides the process of the fourteenth or fifteenth aspect, wherein $R^1$ is hydrogen or $C_1$-$C_8$ alkyl.

In a seventeenth aspect, the invention provides a process a process for preparing a compound of the formula

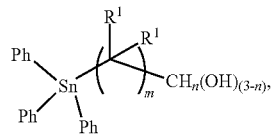

wherein each $R^1$ is independently chosen from H, $C_1$-$C_8$ alkyl, $C_2$-$C_8$ alkenyl, $C_2$-$C_8$ alkynyl, and aryl; which comprises treatment of a compound of the formula

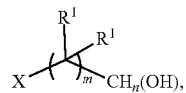

with a compound of the formula $R^2$—$C_1$, in the presence of a base, to afford a compound of the formula

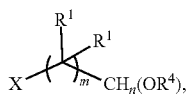

wherein $R^2$ is chosen from groups of the formulae —Si$(CH_3)_3$, —Si$(CH_2CH_3)_3$, —Si(isopropyl)$_3$, —Si(t-butyl)$_2$(phenyl), and —Si$(CH_3)_2$(t-butyl); followed by treatment with a compound of the formula (phenyl)$_3$SnNa, to afford a compound of the formula

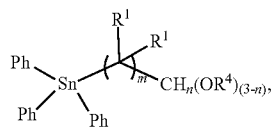

followed by deprotection of the hydroxy group.

In an eighteenth aspect, the invention provides a compound chosen from compounds of Formulae (II) and (III):

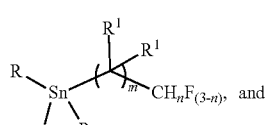

(II)

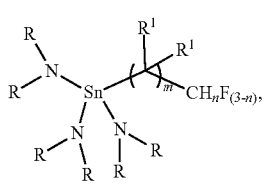

(III)

wherein R is independently chosen from H, $C_1$-$C_8$ alkyl, $C_2$-$C_8$ alkenyl, $C_2$-$C_8$ alkynyl, aryl, $C_1$-$C_8$ perfluorinated alkyl, $C_1$-$C_8$ partially fluorinated alkyl, and $R^1$ is chosen from H, $C_1$-$C_8$ alkoxy, $C_1$-$C_8$ alkyl, $C_2$-$C_8$ alkenyl, $C_2$-$C_8$ alkynyl, aryl, $C_1$-$C_8$ perfluoroalkoxy, $C_1$-$C_8$ perfluoroalkyl, and $C_1$-$C_8$ partially fluorinated alkyl, and m is 0-4, and n is 0-3.

In a nineteenth aspect, the invention provides the compound of the eighteenth aspect, wherein R is methyl.

In a twentieth aspect, the invention provides the compound of the eighteenth or nineteenth aspect, wherein $R^1$ is hydrogen or $C_1$-$C_8$ alkyl.

In a twenty-first aspect, the invention provides a process for the deposition of a tin-containing film onto a surface of a microelectronic device in a reaction zone, which comprises introducing into the reaction zone, a precursor composition comprising at least one compound chosen from Formulae (I) and (III):

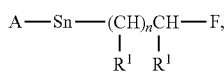  (I)

wherein Y is a group of the formula

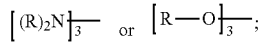

wherein R is independently chosen from H, $C_1$-$C_8$ alkyl, $C_2$-$C_8$ alkenyl, $C_2$-$C_8$ alkynyl, aryl, $C_1$-$C_8$ perfluorinated alkyl, $C_1$-$C_8$ partially fluorinated alkyl, and $R^1$ is chosen from H, $C_1$-$C_8$ alkoxy, $C_1$-$C_8$ alkyl, $C_2$-$C_8$ alkenyl, $C_2$-$C_8$ alkynyl, aryl, $C_1$-$C_8$ perfluoroalkoxy, $C_1$-$C_8$ perfluoroalkyl, and $C_1$-$C_8$ partially fluorinated alkyl, and m is 0-4, and n is 0-3; and

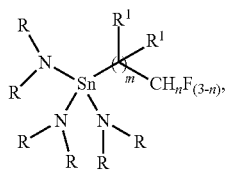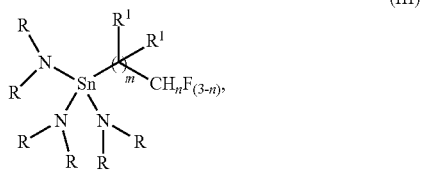  (III)

wherein R is independently chosen from H, $C_1$-$C_8$ alkyl, $C_2$-$C_8$ alkenyl, $C_2$-$C_8$ alkynyl, aryl, $C_1$-$C_8$ perfluorinated alkyl, $C_1$-$C_8$ partially fluorinated alkyl, and $R^1$ is chosen from H, $C_1$-$C_8$ alkoxy, $C_1$-$C_8$ alkyl, $C_2$-$C_8$ alkenyl, $C_2$-$C_8$ alkynyl, aryl, $C_1$-$C_8$ perfluoroalkoxy, $C_1$-$C_8$ perfluoroalkyl, and $C_1$-$C_8$ partially fluorinated alkyl, and m is 0-4, and n is 0-3; and at least one counter-reactant chosen from compounds capable of reacting with reacting with —O—$R^2$ and —N($R^2$)$_2$ moieties, wherein $R^2$ is chosen from $C_1$-$C_4$ alkyl, under vapor deposition conditions.

In a twenty-second aspect, the invention provides the process of the twenty-first aspect, wherein the precursor composition comprises at least one compound chosen from Formula (I) wherein Y is a group of the formula

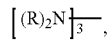, and wherein each R is independently chosen from methyl, ethyl, isopropyl, and t-butyl;

and $R^1$ is chosen from hydrogen, methyl, and ethyl.

In a twenty-third aspect, the invention provides the process of the twenty-first aspect, wherein the precursor composition comprises at least one compound chosen from Formula (I), wherein Y is a group of the formula

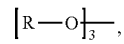, and wherein each R is independently chosen from methyl, ethyl, isopropyl, and t-butyl;

and $R^1$ is chosen from hydrogen, methyl, and ethyl.

In a twenty-fourth aspect, the invention provides the process of the twenty-first, twenty-second, or twenty-third aspects, wherein R is methyl.

In a twenty-fifth aspect, the invention provides the process of any one of the twenty-first through the twenty-fourth aspects, wherein $R^1$ is hydrogen or $C_1$-$C_8$ alkyl.

In a twenty-sixth aspect, the invention provides a process for depositing an EUV-patternable film onto a surface of a microelectronic device in a reaction zone, which comprises introducing into the reaction zone a precursor composition comprising reactants chosen from:

a. a precursor composition chosen from at least one compound of the Formulae (I) and (III);

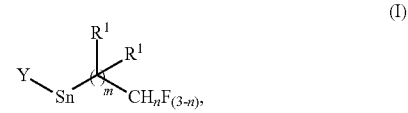  (I)

wherein Y is a group of the formula

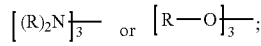;

wherein R is independently chosen from H, $C_1$-$C_8$ alkyl, $C_2$-$C_8$ alkenyl, $C_2$-$C_8$ alkynyl, aryl, $C_1$-$C_8$ perfluorinated alkyl, $C_1$-$C_8$ partially fluorinated alkyl, and $R^1$ is chosen from H, $C_1$-$C_8$ alkoxy, $C_1$-$C_8$ alkyl, $C_2$-$C_8$ alkenyl, $C_2$-$C_8$ alkynyl, aryl, $C_1$-$C_8$ perfluoroalkoxy, $C_1$-$C_8$ perfluoroalkyl, and $C_1$-$C_8$ partially fluorinated alkyl, and m is 0-4, and n is 0-3; and

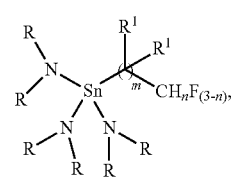  (III)

wherein R is independently chosen from H, $C_1$-$C_8$ alkyl, $C_2$-$C_8$ alkenyl, $C_2$-$C_8$ alkynyl, aryl, $C_1$-$C_8$ perfluorinated alkyl, $C_1$-$C_8$ partially fluorinated alkyl, and $R^1$ is chosen from H, $C_1$-$C_8$ alkoxy, $C_1$-$C_8$ alkyl, $C_2$-$C_8$ alkenyl, $C_2$-$C_8$ alkynyl, aryl, $C_1$-$C_8$ perfluoroalkoxy, $C_1$-$C_8$ Perfluoroalkyl, and $C_1$-$C_8$ Partially fluorinated alkyl, and m is 0-4, and n is 0-3; and b. at least one counter-reactant chosen from compounds capable of reacting with reacting with —O—$R^2$ and —$N(R^2)_2$ moieties, wherein $R^2$ is chosen from $C_1$-$C_4$ alkyl, under vapor deposition conditions.

In a twenty-seventh aspect, the invention provides the process of the twenty-sixth aspect, wherein the precursor composition comprises at least one compound chosen from Formula (I), and wherein Y is a group of the formula

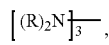

and wherein each R is independently chosen from methyl, ethyl, isopropyl, and t-butyl;

and $R^1$ is chosen from hydrogen, methyl, and ethyl.

In a twenty-eighth aspect, the invention provides the process of the twenty-sixth aspect, wherein the precursor composition comprises at least one compound chosen from Formula (I), and wherein Y is a group of the formula

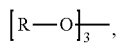

and wherein each R is independently chosen from methyl, ethyl, isopropyl, and t-butyl;

and $R^1$ is chosen from hydrogen, methyl, and ethyl.

In a twenty-ninth aspect, the invention provides the process of the twenty-sixth, twenty-seventh, or twenty-eighth aspect, wherein R is methyl.

In a thirtieth aspect, the invention provides the process of any one of the twenty-sixth through the twenty-ninth aspects, wherein $R^1$ is hydrogen or $C_1$-$C_8$ alkyl.

Having thus described several illustrative embodiments of the present disclosure, those of skill in the art will readily appreciate that yet other embodiments may be made and used within the scope of the claims hereto attached. Numerous advantages of the disclosure covered by this document have been set forth in the foregoing description. It will be understood, however, that this disclosure is, in many respects, only illustrative. The disclosure's scope is, of course, defined in the language in which the appended claims are expressed.

What is claimed is:

1. A compound of the Formula (I):

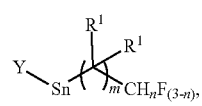

wherein Y is a group of the formula

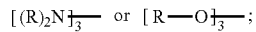

wherein R is independently chosen from H, $C_1$-$C_8$ alkyl, $C_2$-$C_8$ alkenyl, $C_2$-$C_8$ alkynyl, aryl, $C_1$-$C_8$ perfluorinated alkyl, $C_1$-$C_8$ partially fluorinated alkyl, and $R^1$ is chosen from H, $C_1$-$C_8$ alkoxy, $C_1$-$C_8$ alkyl, $C_2$-$C_8$ alkenyl, $C_2$-$C_8$ alkynyl, aryl, $C_1$-$C_8$ perfluoroalkoxy, $C_1$-$C_8$ perfluoroalkyl, and $C_1$-$C_8$ partially fluorinated alkyl, and m is 0-4, and n is 0.

2. The compound of claim 1, wherein Y is a group of the formula

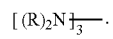

3. The compound of claim 1, wherein Y is a group of the formula

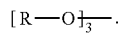

4. The compound of claim 1, wherein R is chosen from $C_1$-$C_3$ alkyl.

5. The compound of claim 1, wherein R is chosen from methyl, ethyl, and isopropyl.

6. The compound of claim 1, wherein $R^1$ is chosen from hydrogen, methyl, or ethyl.

7. The compound of claim 1, wherein R is chosen from methyl, ethyl, and isopropyl, and wherein $R^1$ is chosen from hydrogen, methyl, or ethyl.

8. The compound of claim 1, wherein R is methyl and $R^1$ is methyl.

* * * * *